(12) United States Patent
Voldman et al.

(10) Patent No.: US 6,680,520 B2
(45) Date of Patent: Jan. 20, 2004

(54) METHOD AND STRUCTURE FOR FORMING PRECISION MIM FUSIBLE CIRCUIT ELEMENTS USING FUSES AND ANTIFUSES

(75) Inventors: Steven H. Voldman, South Burlington, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 09/525,088

(22) Filed: Mar. 14, 2000

(65) Prior Publication Data

US 2002/0113297 A1 Aug. 22, 2002

(51) Int. Cl.[7] .......................... H01L 29/00; H01L 23/58
(52) U.S. Cl. ..................... 257/532; 257/665; 257/223; 257/306; 257/521; 257/530
(58) Field of Search .................... 257/665, 532, 257/306–308, 296, 223, 906–908, 529, 530; 330/2, 51, 107, 109; 438/957, 253–254, 396–398; 327/525, 337; 365/96, 225.7

(56) References Cited

U.S. PATENT DOCUMENTS

| | | | | |
|---|---|---|---|---|
| 4,006,405 A | * | 2/1977 | Greenwood et al. | 324/34 |
| 4,190,854 A | * | 2/1980 | Redfern | 257/532 |
| 4,687,951 A | * | 8/1987 | McElroy | |
| 5,353,028 A | | 10/1994 | deWit et al. | 341/172 |
| 5,512,857 A | * | 4/1996 | Koskowich | 330/252 |
| 5,760,674 A | | 6/1998 | Gilmour et al. | 337/297 |
| 5,795,819 A | | 8/1998 | Motsiff et al. | 438/618 |
| 5,808,351 A | | 9/1998 | Nathan et al. | 257/528 |
| 6,011,433 A | * | 1/2000 | Nairn | 330/2 |
| 6,191,025 B1 | * | 2/2001 | Liu et al. | |

* cited by examiner

Primary Examiner—Long Pham
Assistant Examiner—Dilinh Nguyen
(74) Attorney, Agent, or Firm—Richard A. Henkler; Cantor Colburn LLP (57) ABSTRACT

The present invention describes an apparatus and method for fabrication of a precision circuit elements. In particular, the circuit elements are fabricated as part of an integrated circuit assembly. The processing of the circuit elements is such to provide a nominal circuit element value close in value to the desired value. Additional trim circuit elements are joined to the nominal circuit element through links. The links are fusible links or antifuses. By selectively blowing the fusible links or fusing the antifuses, trim circuit elements are added or subtracted to personalize the value of the nominal circuit element. A capacitor is used in an illustrative example.

11 Claims, 6 Drawing Sheets

FIG. 9B

METHOD AND STRUCTURE FOR FORMING PRECISION MIM FUSIBLE CIRCUIT ELEMENTS USING FUSES AND ANTIFUSES

BACKGROUND OF THE INVENTION

This invention generally relates to semiconductor integrated circuits and specifically to a method of fabricating precision circuit elements therein.

In the fabrication of electrical circuits, especially those formed in semiconductor integrated circuits, processing variations often prevent the manufacture of precise components, for example resistors and capacitors. Accordingly, there is a need for a method of trimming devices to obtain the precise values.

Precision capacitors are required in a wide variety of integrated circuit applications. Decoupling capacitors are used for analog $V_{DD}$ to ground or analog $V_{DD}$ to another power source. Phase-locked-loops (PLL) are another application. Precision capacitors find wide usage in bipolar CMOS RF (radio frequency) applications for wired and wireless telephony and, recently, in series with the input of receivers operating in the gigahertz region.

Trimming of capacitors finds application in A/D and D/A converters where the capacitors need to be matched. Experimentally, it has been shown that in fabricating the capacitors utilizing MOS technology, acceptable ratio matching accuracies of up to 10 bits can be obtained with good yields. However, to achieve accuracy greater than 10 bits, external means such as laser trimming is required to change the size and value of the capacitors as required which, in turn, will increase the typical yield. However, laser trimming is a very expensive and time consuming procedure. Another problem with laser trimming is that it must be performed at the wafer level before the device is packaged. Capacitor precision is affected by stray capacitance induced by the proximity of the packaging material.

Integrated circuit capacitors are formed as metal-insulator-metal capacitors (MIM caps). "Back end of line" (BEOL) refers to the fabrication of the integrated circuit that occurs after the die contacts have been attached. BEOL MIM caps have replaced the very large area silicon capacitors in an effort to save silicon wafer area. However, the MIM caps are not as close to the external package as desired. The closer the precision capacitor to the external package, the better the effectiveness of the MIM capacitor. Another reason the MIM caps are not precision capacitors is due to the high variability in thickness of the deposited insulator (dielectric).

MIM capacitors are used on RF receiver circuits. MIM capacitors are sensitive to electrical overstress (EOS) and electrostatic discharge (ESD) events. MIM capacitors fail at human body model (HBM) ESD events of 100 to 300 Volts. The need to isolate the failing section of the MIM capacitor or eliminate the fail mechanism is important for circuit reliability and yield.

Fuses have been used to aid in compensating for variations in manufactured components. For instance, a fuse may be used to selectively connect additional elements to create the desired output. This has been performed at the wafer level of fabrication of the semiconductor or microcircuit. Once the wafer is diced and packaged the component values are affected. This is particularly true of capacitors which are sensitive to packaging material and other sources of stray capacitance. Therefore, for precision components it is desirable to set the values of the fuses (i.e., open or short) subsequent to packaging.

Accordingly, improvements which overcome any or all of the problems are presently desirable.

BRIEF SUMMARY OF THE INVENTION

The present invention describes an apparatus and method for fabrication of a precision capacitor. In particular, the capacitors are fabricated as part of an integrated circuit assembly. The processing of the capacitor is such to provide a nominal capacitor close in value to the desired value. Additional trim capacitors are joined to the nominal capacitor through links. The links are fusible links or antifuses. By selectively blowing the fusible links or fusing the antifuses, trim capacitances are added or subtracted to personalize the nominal capacitor. The links are available for blowing or fusing, as appropriate, at any point in the manufacturing process or packaging level to personalize the capacitance.

Further achieved is the capability of creating a precision capacitor and isolating segments of the precision capacitor which impact yield or fail due to EOS and ESD events. Such capacitor arrangements also provide an opportunity to determine failed capacitor locations for reliability purposes as well as an opportunity of providing redundant capacitors that can be introduced when a capacitor is damaged. This provides a mechanism of salvaging an otherwise irreparable microcircuit in the field.

A better understanding of the features and advantages of the present invention will be obtained by reference to the following detailed description of the invention and accompanying drawings that set forth an illustrative embodiment in which the principles of the invention are utilized.

BRIEF DESCRIPTION OF THE DRAWINGS

A better understanding of the features and advantages of the present invention will become better understood with regard to the following detailed description, appended claims, and the accompanying drawings where:

DETAILED DESCRIPTION OF THE INVENTION

Figure 1:
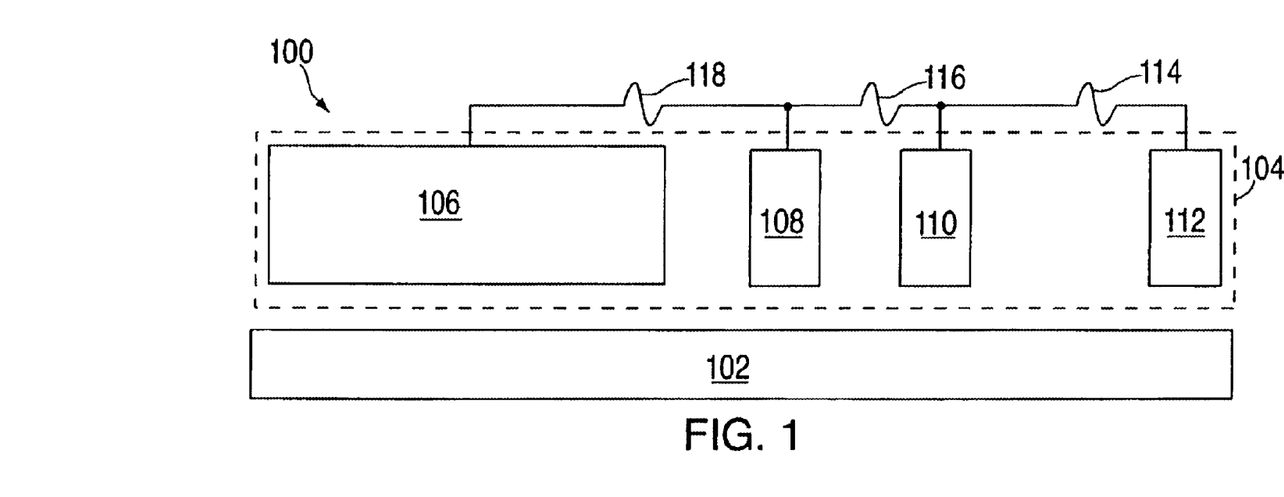
FIG. 1 shows a pictorial representation of a capacitor personalized by selectively blowing fuses of parallel connected capacitor plates.

A pictorial of the present invention is shown in FIG. 1, where capacitor formation in an integrated circuit die is generally shown as (100). The capacitor is formed by deposition of a common plate (102) and a top plate (104) separated by a dielectric (not shown). The top plate (104) is comprised of a core plate (106) and a plurality of smaller trim plates. Three such trim plates (108), (110), and (112) are shown for illustration purposes only and not for limitation. The number and size of the trim plates is based upon circuit design criteria. The trim plates (108), (110), and (112) are coupled by links (114) and (116). Trim plate (108) is coupled to the core plate (106) by the fusible link (118). The capacitance of the capacitor so formed is measured after the integrated circuit die is packaged. When the links are fusible links, the capacitance of this capacitor is personalized by selectively blowing the fusible links to decrease the capacitance and create a precision capacitor in the packaged die.

Alternatively, antifuses can be substituted for the links (118), (116), and (114) of FIG. 1. In this configuration the antifuses are selective blown to create an electrical path to the trim plates (108), (110), and (112), respectively, and personalize the capacitance. Capacitance is increased with the addition of each trim plate.

Antifuses are structures that, when first fabricated, are an open circuit. When the antifuse is "fused," the open circuit becomes closed and conduction across the antifuse becomes possible. Thus, antifuses are used to perform the opposite function of a fuse. Typically an antifuse is fused by applying a sufficient voltage, called a "fusing voltage" across the antifuse structure. This voltage causes a current to flow and the structure to fuse together, resulting in a permanent electrical connection. "Fuses are "blown" by applying a voltage across the fuse structure. This voltage causes a current to flow and the structure to open, resulting in a permanent open circuit. Personalization by fusing of antifuses or blowing of fuses can be achieved by any known means including a laser beam through an integrated circuit access window or, more likely, access to the links via package pins.

Figure 2:
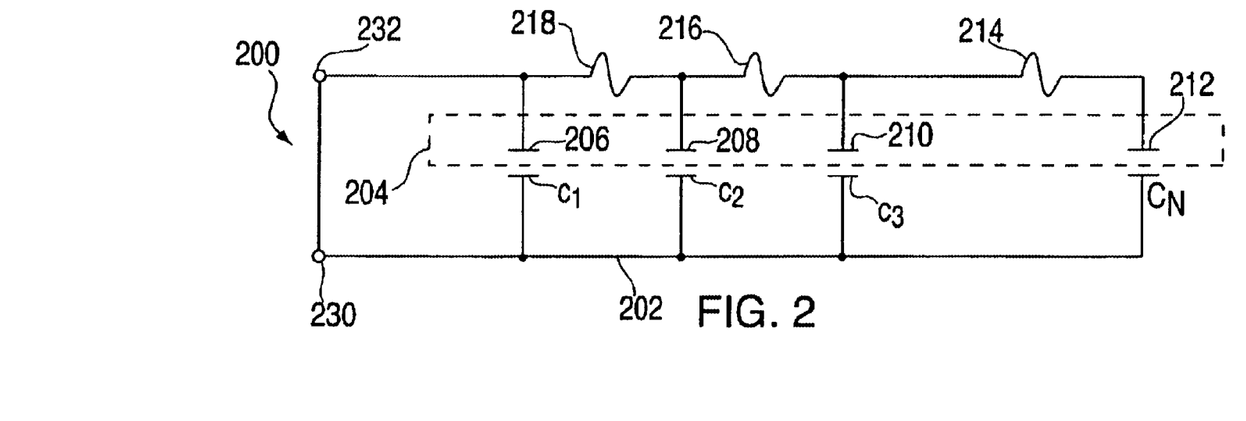
FIG. 2 shows a schematic circuit diagram of the pictorial of FIG. 1 wherein capacitance is personalized by selectively blowing fuses of parallel connected capacitors.

A schematic representation of the precision capacitor of FIG. 1 is generally shown as (200) in FIG. 2. A common plate (202) is coupled to a first terminal (230). The common plate (202) of capacitor (204) also forms capacitors with trim plates (208), (210), and (212). Trim plate (212) is coupled by a link (214) to the trim plate (210). Similarly, the trim plate (210) is coupled by a link (216) to the trim plate (208); and the trim plate (208) is coupled by a link (218) to a core plate (206). The core plate (206) is thence coupled to a second terminal (232). Trim plates (208), (210), and (212) represent the trim plates (108), (110), and (112) described in FIG. 1 herein above. Capacitor (206) represents the core plate described in FIG. 1 herein above. Selective blowing of links (214), (216), and (218), respectively, decreases the value of the capacitance between first terminal (230) and second terminal (232).

Alternatively, antifuses can be substituted for the links (218), (216), and (214) of FIG. 2. In this configuration the antifuses are selectively fused to create an electrical path to the trim plates (208), (210), and (212), respectively, and personalize the capacitance. Capacitance is increased with the addition of each trim plate.

Figure 3:
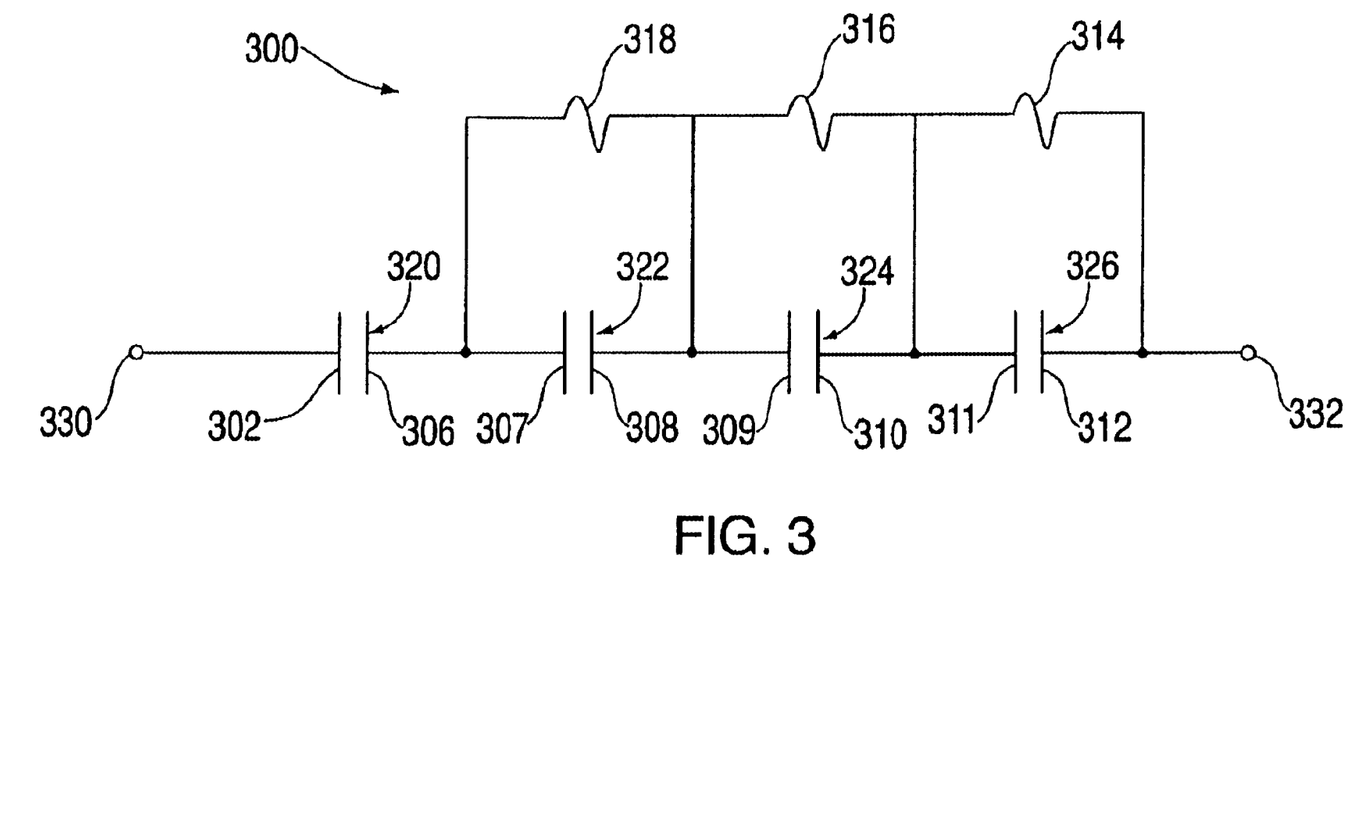
FIG. 3 shows a circuit diagram wherein capacitance is personalized by blowing fuses of series connected capacitors.

An alternative embodiment of the present invention is generally shown as (300) in FIG. 3 wherein the personalizing capacitors are series connected. A first plate (302) of a first capacitor (320) is coupled to a first terminal (330). A second plate (306) of first capacitor (320) is connected to a first plate (307) of a second capacitor (322). A link (318) is connected in parallel with the second capacitor (322) from first plate (306) to a second plate (308) of the second capacitor (322). The second plate (308) of the second capacitor (322) is connected to a first plate (309) of a third capacitor (324). A link (316) is connected in parallel with the third capacitor (324) from first plate (308) to a second plate (310) of the third capacitor (324). The second plate (310) of the third capacitor (324) is connected to a first plate (311) of a fourth capacitor (326). A link (314) is connected in parallel with the fourth capacitor (326) from first plate (310) to a second plate (312) of the fourth capacitor (326). The second plate (312) of the fourth capacitor (326) is connected to a second terminal (332). When the links are fusible links, selective blowing of links (314), (316), and (318), respectively, decreases the value of the capacitance between first terminal (330) and second terminal (332).

Alternatively, antifuses can be substituted for the links (318), (316), and (314) of FIG. 3. In this configuration the antifuses are selectively fused to create an electrical path shorting (320), (322), and (324), respectively, and personalizing the capacitance. Capacitance between terminals (330) and (332) is increased as each series connected capacitor is shorted.

Figure 4:
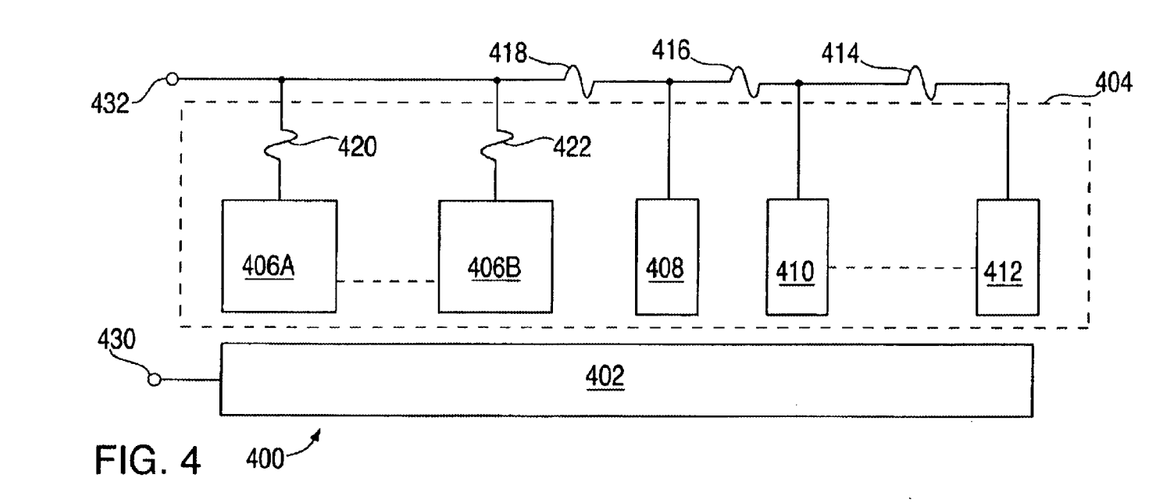
FIG. 4 shows a pictorial embodiment of an parallel capacitor alternative arrangement wherein a back up capacitor is used.

An alternative embodiment in FIG. 4 where a redundant capacitor is formed in 5 addition to trim plates is generally shown as (400). The capacitor is formed by deposition of a common plate (402) and a top plate (404) separated by a dielectric (not shown). The bottom plate (402) may be made accessible via a terminal (430) if desired. The top plate (404), which may be made accessible via a terminal (432) if desired, is comprised of a core plate (406A), a plurality of redundant core plates (406B), and a plurality of smaller trim plates. One such redundant core plates (406B), and three such trim plates (408), (410), and (412) are shown for illustration purposes only and not for limitation. The number of redundant core plates and the number and size of the trim plates is based upon circuit design criteria. The trim plates (408), (410), and (412) are coupled by links (414) and (416). Trim plate (408) is coupled by a link (418) to the redundant core plate (406B) via a link (422) and to the core plate (406A) via a link (420). The capacitance of the capacitor (400) so formed is measured after the integrated circuit die is packaged. When the links are fuses, the capacitance of this capacitor is personalized by selectively blowing the links to decrease the capacitance and create a precision capacitor in the packaged die.

Alternatively, antifuses can be substituted for the links (418), (416), and (414) of FIG. 4. In this configuration the antifuses are selective blown to create an electrical path to the trim plates (408), (410), and (412), respectively, and personalize the capacitance. Capacitance is increased with the addition of each trim plate.

Figure 5:
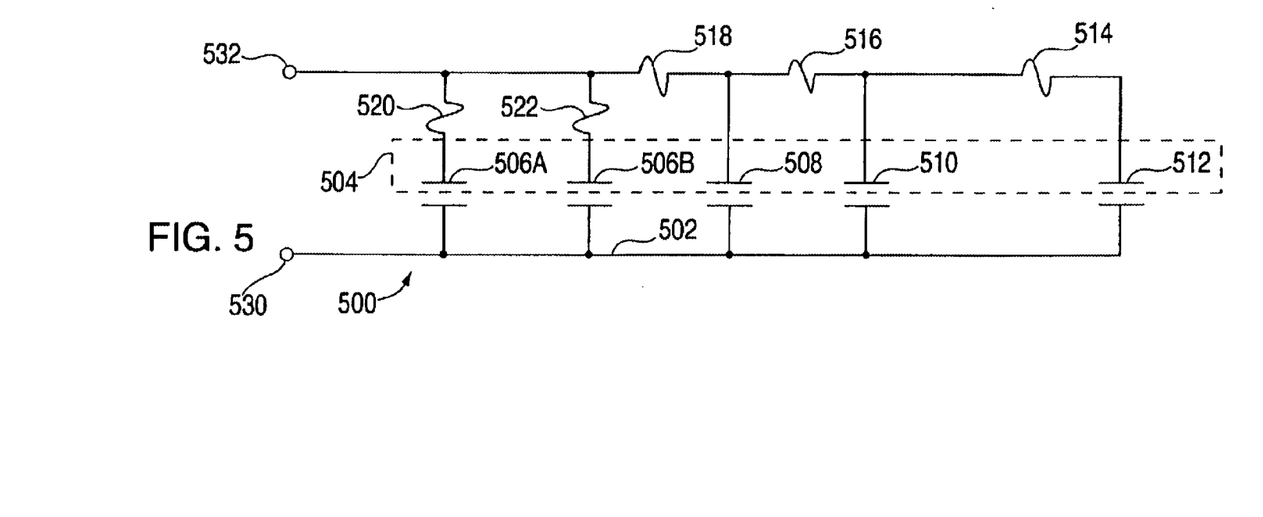
FIG. 5 shows a schematic circuit diagram of the pictorial of FIG. 4 wherein a back up capacitor is used in addition to personalizing capacitors.

A schematic representation of the precision capacitor of FIG. 4 is generally shown as (500) in FIG. 5. A common plate (502) is coupled to a first terminal (530). The common plate (502) of capacitor (504) also forms capacitors with trim plates (508), (510), and (512). Trim plate (512) is coupled by a link (514) to the trim plate (510). Similarly, the trim plate (510) is coupled by a link (516) to the trim plate (508); and trim plate (508) is coupled by a link (518) to the redundant core plate (506B) via a link (522) and to the core plate (506A) via a link (520). Trim plates (508), (510), and (512) represent the trim plates (408), (410), and (412) described in FIG. 4 herein above. Capacitor (506A) and (506B) represents the core plate and redundant plate, respectively, described in FIG. 4 herein above and may also be connected to a second terminal (532) if desired. When the links are fuses, selective blowing of links (514), (516), and (518), respectively, decreases the value of the capacitance between first terminal (530) and second terminal (532).

An advantage of this embodiment is realized when links (520) and (522) are antifuses. In this arrangement, a failure of a core plate (506A) can be isolated and remedied by fusing of antifuse (522).

Alternatively, antifuses can be substituted for the links (518), (516), and (514) of FIG. 5. In this configuration the antifuses are selectively fused to create an electrical path to the trim plates (508), (510), and (512), respectively, and personalize the capacitance. Capacitance is increased with the addition of each trim plate.

Figure 6A:
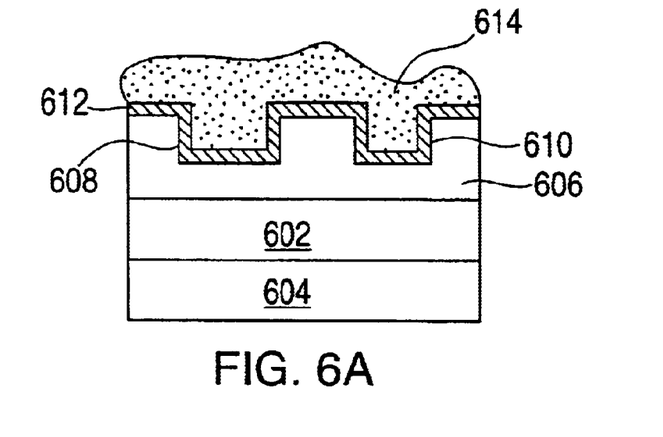
FIGS. 6A–6C is a pictorial cross-sectional view of the fabrication of a conductor and a fuse by a Damascene process.
Figure 6B:
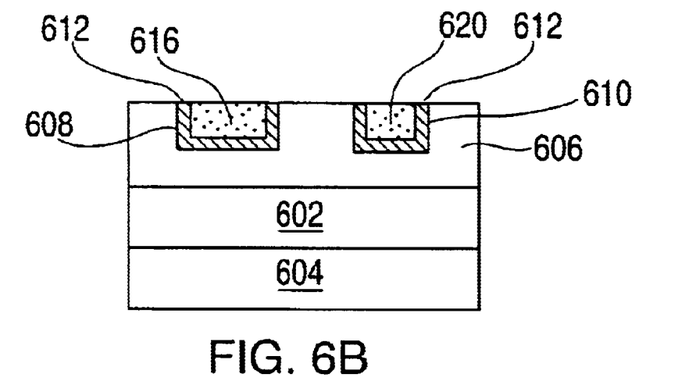
Figure 6C:
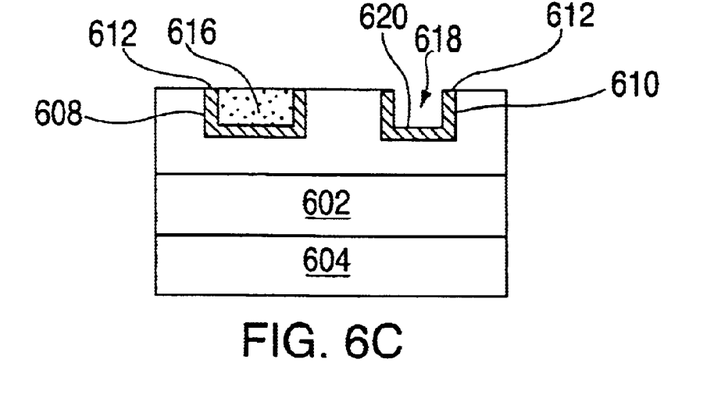

The fusible link structure preferably is formed concurrently with the capacitor structure, where, in this case, the capacitor structure consists of a copper electrode, a trough, a deposited dielectric, the liner film and then a second copper electrode. The method of construction can be a Damascene process as shown in FIGS. 6A through 6C. In an illustrative example of this process shown in FIG. 6A, a first insulator film referred to as an interlevel dielectric, ILD1, (602) is formed on a silicon substrate (604). A second interlevel dielectric, ILD2, (606) is deposited upon ILD1 (602). Multiple interlevel dielectrics can be deposited in order to create multiple insulated levels of microcircuitry. A reactive ion etch (RIE) creates troughs (608) and (610) in ILD2 (606) which will ultimately form a copper connector and a fuse in this example. A first refractory liner (612) is deposited over the exposed surfaces. A copper deposition (614) is applied to fill the troughs (608) and (610).

A polishing operation removes the excess copper so that only the troughs (608) and (610) are filled with copper as shown in FIG. 6B. The copper forms conductive troughs (616) and (620). A mask, not shown, is used to allow removal of a portion of copper from the trough (620). The open portion of the trough (620) forms a fuse (618) by having only the liner (612) available to carry the current input therethrough. This fuse (618) can be blown in two ways: first excessive current in the trough (620) will cause overheating over the liner (612) and the liner will open circuit; secondly, a laser can be directed at the bare liner (612) to cause the fuse (618) to open. Alternatively, the copper could be left in the fuse (618) and a laser could be directed at the fuse (618 to cause it to open.

Figure 7A:
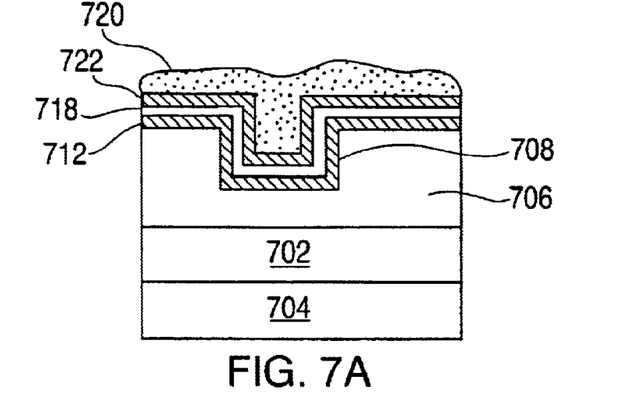
FIGS. 7A–7B. is a pictorial cross-sectional view of the fabrication of a capacitor by a Damascene process.
Figure 7B:
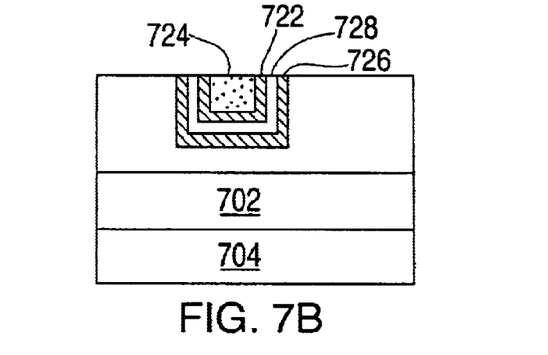

One method of forming a capacitor is shown in FIGS. 7A–7B. The trough (708) is etched into ILD2 (706) and overlayed with liner (712). Liner (712) is overlayed with an insulator (718). A second liner (722) is deposited on the insulator (718). A copper deposition (720) fills the remainder of trough (708). A polishing operation removes the excess copper to create a capacitor, shown in FIG. 7B, consisting of one plate (724) separated from a second plate (726) by a dielectric (728).

Figure 8:
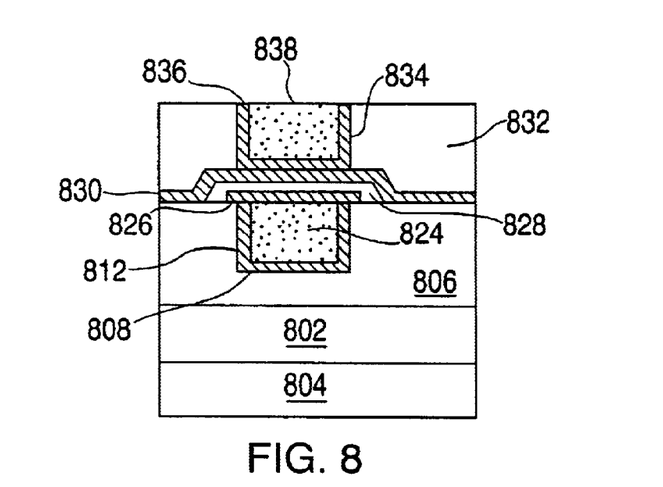
FIG. 8 is a pictorial cross-sectional view of an alternative method of creating a capacitor where both plates are copper.

An alternative method of forming a capacitor is shown in FIG. 8. The trough (808) is etched into an ILD2 (806) and overlayed with a refractory liner (812). A copper deposition fills the trough and is polished as herein above described to create a first copper plate (824). A second liner of refractory metal (826) is deposited to overlay the first copper plate (824). An oxide dielectric (828) is deposited on top of the second liner (826). A third liner (830) overlays the oxide dielectric (828). An additional ILD3 (832) overlays the first copper plate (824), second liner (826), oxide dielectric (828), and third liner (830). In a similar manner a trough (834) is etched into ILD3 (832) to expose third liner (830). A fourth liner (836) overlays the trough (834). Copper is deposited on top of the fourth liner (836), and the excess polished off to create a second copper plate (838). A capacitor is thereby formed of second copper plate (838), dielectric (828), and first copper plate (824).

Figure 9A:
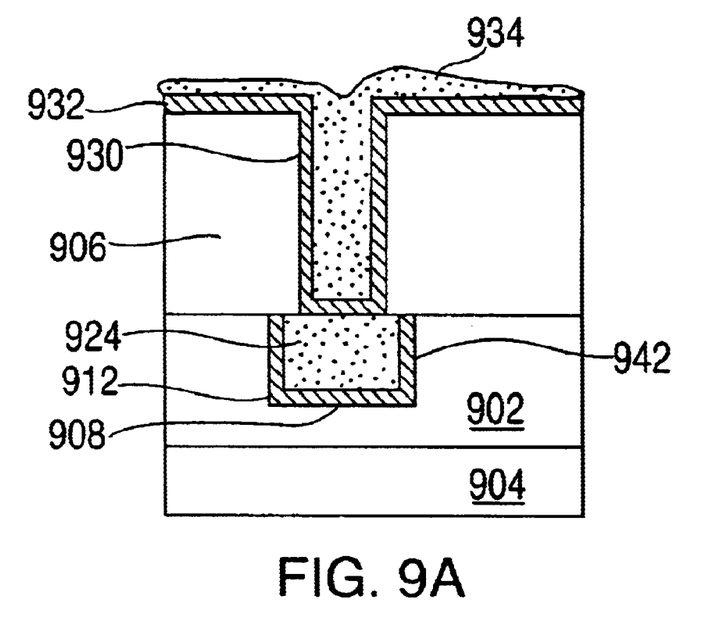
FIGS. 9A–9B is a pictorial cross-sectional view of a dual Damascene process creating a capacitor and via to another microcircuit level.
Figure 9B:
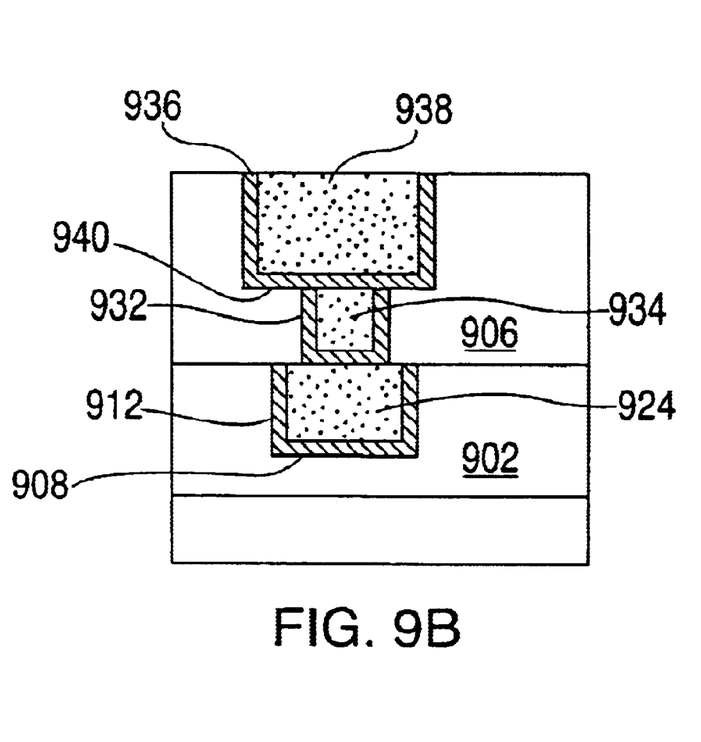

A double Damascene process can also be used. In this methods two troughs are etched as shown in illustrative FIGS. 9A–9B wherein a conductor (924) on one ILD is connected to a second conductor (938) on another ILD by a via conductor (934), as seen in FIG. 9B. The via between microcircuit levels may be a copper interconnect, a resistive or capacitive element, or other circuit element to connect the different levels. In FIG. 9A, a first etch creates a trough (908) in ILD2 (902). A first liner (912) is deposited in the trough (908). A copper deposition fills the remainder of the trough (908) and the excess copper and first liner (912) are polished off to create a first conductor (924). ILD2 (906) is deposited to overlay the circuitry of ILD1 (906). A second etch begins a double Damascene process by etching a second trough (930) (shown in FIG. 9A) deep enough to expose the first conductor (924). A second liner overlays the second trough (930) and the second trough is filled with copper (934), in this illustrative example. The excess copper and liner are polished off and a third etch creates the third trough (940) as shown in FIG. 9B. A third liner (936) overlays the third trough (940) and a copper deposition fills the third trough. A third polishing operation created the second conductor (938). A conductive link between two ILD has been created by the double Damascene process that created two troughs 930 and 940.

While a preferred embodiment has been shown and described, various modifications and substitutions may be made thereto without departing from the spirit and scope of the invention. Accordingly, it is to be understood that the present invention has been described by way of illustration and not limitation.

What is claimed is:

1. A precision circuit element for an integrated circuit, comprising:
   a core circuit element formed within an integrated circuit substrate by damascene processing;
   a plurality of trim circuit elements formed within said integrated circuit substrate by damascene processing;
   a plurality of links having a first end and a second end, said first end connected to one of said trim elements and said second end connected to another of said trim elements such that no trim element is connected to more than two of said links; and
   a core circuit element link having a core circuit element link first end and a core circuit element link second end, said core circuit element link first end connected to said core circuit element and said core circuit element link second end connected to one of said trim elements.

2. A precision capacitor for an integrated circuit, comprising:
   a core plate formed within an integrated circuit substrate by damascene processing;
   a plurality of trim plates formed within said integrated circuit substrate by damascene processing;
   a plurality of links having a first end and a second end, said first end connected to one of said trim plates and said second end connected to another of said trim plates such that no trim plate is connected to more than two of said links;
   a core plate link having a core plate link first end and a core plate link second end, said core plate link first end connected to said core plate and said core plate link second end connected to one of said trim plates; and a common plate capacitively coupled to said core plate and said trim plates.

3. The precision capacitor of claim 2 wherein said links and core plate link are fusible links.

4. The precision capacitor of claim 2 wherein said links and core plate link are antifuses.

5. A precision capacitor for an integrated circuit, comprising:
- a plurality of trim plates formed within an integrated circuit substrate by damascene processing;
- a plurality of links having a first end and a second end, said first end connected to one of said trim plates and said second end connected to another of said trim plates such that no trim plate is connected to more than two of said links;
- one or more redundant plates formed within said integrated circuit substrate by damascene processing;
- one or more redundant plate links having a redundant plate link first end and a redundant plate link second end, each of said redundant plate link first ends connected to one of said redundant plates and said redundant plate link second ends all connected to one of said trim plates; and
- a common plate capacitively coupled to said redundant plates and said trim plates.

6. The precision capacitor of claim 5 wherein said links and said redundant plate links are antifuses and/or fusible links.

7. A precision capacitor for an integrated circuit, comprising:
- a capacitor having a first plate and a second plate formed within an integrated circuit substrate by damascene processing, said first plate capacitively coupled to said second plate;
- a plurality of trim capacitors, formed within said integrated circuit substrate by damascene processing, each having a first trim plate and a second trim plate said first trim plate capacitively coupled to said second trim plate; said trim capacitors series connected to said capacitor; and one or more links said links connected in parallel with one or more of said trim capacitors.

8. The precision capacitor of claim 7 wherein said links are fusible links and/or antifuses.

9. The precision capacitor of claim 7 wherein said first trim plate of one of said plurality of trim capacitors comprises said second plate of said capacitor.

10. The precision capacitor of claim 7 wherein said first trim plate of at least one of said plurality of said trim capacitors comprises said second plate of another of said plurality of said trim capacitors.

11. A precision capacitor for an integrated circuit, comprising:
- a common plate formed within an integrated circuit substrate by damascene processing; and
- a top plate formed within said integrated circuit substrate by damascene processing, said top plate further comprising:
  - a core plate;
  - a redundant plate, said redundant plate providing a back up capacitance to said core plate; and
  - a plurality of trim plates, comprising a first trim plate and a series of subsequent trim plates, said first trim plate selectively capacitively coupled to said core plate and said redundant core plate;
  - each of said subsequent trim plates capacitively coupled to either said first trim plate of another of said subsequent trim plates.

* * * * *